(12) United States Patent
Xiao et al.

(10) Patent No.: US 11,385,491 B2
(45) Date of Patent: Jul. 12, 2022

(54) DISPLAY DEVICE, ELECTRONIC DEVICE AND DEVICE MOUNTING MEMBER

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Jun Xiao, Beijing (CN); Wei Huang, Beijing (CN)

(73) Assignees: K-Tronics (Suzhou) Technology Co., Ltd., Jiangsu (CN); BOE Technology Group Co., Ltd., Beijing (CN)

( * ) Notice: Subject to any disclaimer, the term of this patent is extended or adjusted under 35 U.S.C. 154(b) by 149 days.

(21) Appl. No.: 16/767,386

(22) PCT Filed: Jun. 13, 2019

(86) PCT No.: PCT/CN2019/091143
§ 371 (c)(1),
(2) Date: May 27, 2020

(87) PCT Pub. No.: WO2020/248196
PCT Pub. Date: Dec. 17, 2020

(65) Prior Publication Data
US 2021/0405436 A1    Dec. 30, 2021

(51) Int. Cl.
*G02F 1/1333* (2006.01)
*H05K 7/20* (2006.01)

(52) U.S. Cl.
CPC ... *G02F 1/133385* (2013.01); *H05K 7/20972* (2013.01)

(58) Field of Classification Search
None
See application file for complete search history.

(56) References Cited

U.S. PATENT DOCUMENTS

2009/0266513 A1    10/2009  Xiong et al.
2010/0226091 A1*    9/2010  Dunn ............... G02F 1/133385
                                                        361/695

FOREIGN PATENT DOCUMENTS

| CN | 101573017 A | 11/2009 |
| CN | 103732036 A | 4/2014 |
| CN | 108347857 A | 7/2018 |
| KR | 1020150079324 A | 7/2015 |

* cited by examiner

*Primary Examiner* — Richard H Kim
(74) *Attorney, Agent, or Firm* — The Webb Law Firm

(57) ABSTRACT

The present disclosure relates to a display device, an electronic device and a device mounting member. The display device includes: a first display module having a first backplane; a second display module having a second backplane located on an opposite side of the first backplane; a first heat sink located between the first backplane and the second backplane; and a second heat sink connected to the first heat sink in thermal conduction.

19 Claims, 6 Drawing Sheets

DISPLAY DEVICE, ELECTRONIC DEVICE AND DEVICE MOUNTING MEMBER

CROSS-REFERENCE TO RELATED APPLICATION

This application is the United States national phase of International Application No. PCT/CN2019/091143 filed Jun. 13, 2019, the disclosure of which is hereby incorporated by reference in its entirety.

TECHNICAL FIELD

The present disclosure relates to a display device, an electronic device and a device mounting member.

BACKGROUND

During the operation process of the outdoor display device, the heat produced by the display module used in the display device cannot be effectively emitted, which might reduce the service life of the display device.

SUMMARY

According to one aspect of the present disclosure, a display device is provided. The display device includes: a first display module having a first backplane; a second display module having a second backplane located on an opposite side of the first backplane; a first heat sink located between the first backplane and the second backplane; and a second heat sink connected to the first heat sink in thermal conduction.

In some embodiments, the first heat sink includes: a first heat radiation portion located between the first backplane and the second backplane, and distributed over an entire overlapping area of the first backplane and the second backplane; and a second heat radiation portion integrally formed with the first heat radiation portion and extending beyond the overlapping area of the first backplane and the second backplane; wherein the second heat sink is located on one side of the first display module and the second display module adjacent to the second heat radiation portion, and connected to the second heat radiation portion in thermal conduction.

In some embodiments, the second heat sink includes: a heat conduction block connected to the second heat radiation portion; and a heat radiation fin group located on a surface of the heat conduction block, and integrally formed with the heat conduction block, or disposed on the heat conduction block.

In some embodiments, the heat conduction block has a plate shape and has four side end surfaces, and a first heat radiation surface and a second heat radiation surface that are located between the four side end surfaces and arranged oppositely, wherein the first heat radiation surface is parallel to a display screen of the first display module, and the second heat radiation surface is parallel to a display screen of the second display module.

In some embodiments, the first heat sink includes a plurality of elongated members, each of which includes a linear rod section as the first heat radiation portion and an extension section as the second heat radiation portion, and a plurality of mounting holes are provided in a surface of the heat conduction block on one side adjacent to the extension section, wherein the extension section of each of the plurality of elongated pieces is plugged fixedly within the plurality of mounting holes respectively.

In some embodiments, material of the heat conduction block and the heat radiation fin group is metal.

In some embodiments, the material of the heat conduction block and the heat radiation fin group is aluminum.

In some embodiments, the display device further includes: a third heat sink mounted on the second heat sink or outside the second heat sink, and configured to assist the heat conduction block and the heat radiation fin group to radiate heat.

In some embodiments, the heat radiation fin group includes a plurality of plate type or needle type heat radiation fins entirely or partly distributed along at least one heat radiation surface of the first heat radiation surface and the second heat radiation surface, and the third heat sink includes: one or more first fans, which are disposed on the plurality of plate type or needle type heat radiation fins, fixedly connected with the heat conduction block, and configured to air-cool the heat conduction block and the heat radiation fin group.

In some embodiments, a plurality of needle type heat radiation fins are distributed over an entirety of the first heat radiation surface and an entirety of the second heat radiation surface, the plurality of first fans include at least two axial fans disposed on the needle type heat radiation fins located on the first heat radiation surface and distributed at intervals along a direction parallel to the first heat radiation surface, and at least two axial fans disposed on the needle type heat radiation fins located on the second heat radiation surface and distributed at intervals along a direction parallel to the second heat radiation surface.

In some embodiments, the first heat radiation surface is parallel to the second heat radiation surface, and the plurality of needle type heat radiation fins are parallel to each other, and perpendicular to the first heat radiation surface and the second heat radiation surface, an air inlet end of the axial fan is located on one side of the axial fan adjacent to the heat conduction block, and an air outlet end of the axial fan is located on one side of the axial fan away from the heat conduction block, and a rotation axis of the axial fan is parallel to the plurality of needle type heat radiation fins.

In some embodiments, a length of a needle type heat radiation fin among the plurality of needle type heat radiation fins located in an area where the axial fan is arranged is shorter than a length of a needle type heat radiation fin among the plurality of needle type heat radiation fins located around the area where the axial fan is arranged, so as to form a concave structure in which the axial fan is mounted.

In some embodiments, an air outlet end of the axial fan protrudes toward an air outlet side relative to a needle type heat radiation fin among the plurality of needle type heat radiation fins located around the area where the axial fan is arranged.

In some embodiments, the second heat sink further includes: a cover body having at least one open end, wherein an inner side wall of the cover body at least partially covers the heat conduction block and the heat radiation fin group, and the one or more first fans are configured to exhaust hot air gathered within the cover body outwards via the open end of the cover body.

In some embodiments, the cover body has two open ends that are opposite in position, a plurality of needle type heat radiation fins are distributed over an entirety of the first heat radiation surface and an entirety of the second heat radiation surface, the cover body has four inner side walls, which are respectively closely attached to the four side end surfaces of the heat conduction block, and integrally covered outside the plurality of needle type heat radiation fins in a length direction of the needle type heat radiation fins.

In some embodiments, a plurality of first linear elongated grooves are provided on one side of the first backplane adjacent to the second backplane, and a plurality of second linear elongated grooves are provided on one side of the backplane adjacent to the first backplane, and the plurality of second linear elongated grooves are in one-to-one correspondence with the plurality of first linear elongated grooves, and enclose a plurality of linear accommodating cavities with the plurality of first linear elongated grooves, and linear rod sections of the plurality of elongated members are respectively located in the plurality of linear accommodating cavities.

In one aspect of the present disclosure, an electronic device is provided. The electronic device includes: the display device as described previously.

In some embodiments, the electronic device further includes: a device housing enclosed outside the display device; and a second fan disposed within the device housing and located on a ground side of a first display module and a second display module of the display device; wherein a second heat sink of the display device is located on a sky side of the first display module and the second display module.

In some embodiments, transparent windows are provided at positions of a side wall of the device housing corresponding to the first display module and the second display module of the display device, and an equal ventilation gap is provided between the transparent window and each of the first display module and the second display module of the display device.

In some embodiments, the device housing further includes: one air inlet opened on a side wall of the device housing on the same side as a transparent window corresponding to one of the first display module and the second display module, and located on a ground side of the second fan; and a first air outlet and a second air outlet respectively opened on a first side wall and a second side wall of the device housing opposite and parallel to each other, and located on a sky side of the first display module and the second display module, wherein the first side wall is on the same side as a transparent window corresponding to the first display module, and the second side wall is on the same side as a transparent window corresponding to the second display module; wherein an end of the second heat sink located on a sky side is not higher than the lowest positions of the first air outlet and the second air outlet on a ground side respectively.

In some embodiments, the electronic device further includes: a first air deflector and a second air deflector respectively disposed within the device housing and located inside the first air outlet and the second air outlet, and both located on a sky side of the second heat sink, for guiding an air flow within the device housing to be exhausted outward through the first air outlet and the second air outlet respectively; wherein a first end of the first air deflector located on a sky side is connected to an inner wall surface of the first side wall, the first end of the first air deflector is higher than the highest position of the first air outlet on a sky side, and a second end of the first air deflector on a ground side is disposed at a center position between the first side wall and the second side wall; a first end of the second air deflector located on a sky side is connected to an inner wall surface of the second side wall, the first end of the second air deflector is higher than the highest position of the second air deflector on a sky side, and a second end of the second air deflector located on a ground side is disposed at a center position between the first side wall and the second side wall.

In one aspect of the present disclosure, a device mounting member for cooperating with the display device described previously in use is provided, wherein the device mounting member includes: a device housing internally provided with a mounting area of the display device; and a second fan disposed within the device housing and located on a ground side of the mounting area of the display device.

In some embodiments, two transparent windows are provided in positions of two opposite side walls of the device housing corresponding to the mounting area of the display device, and the two transparent windows are parallel with a spacing greater than a width of the display device in a direction perpendicular to the two transparent windows.

In some embodiments, the device housing further includes: one air inlet opened in a side wall of the device housing on the same side as one of the two transparent windows, and located on a ground side of the second fan; a first air outlet and a second air outlet, which are respectively opened in the two side walls, and both located on a sky side of the mounting area of the display device.

In some embodiments, the device mounting member further includes: a first air deflector and a second air deflector respectively disposed within the device housing and located inside the first air outlet and the second air outlet, and both located on a sky side of the mounting area of the display device, configured to guide an air flow within the device housing to be exhausted outward through the first air outlet and the second air outlet respectively, wherein a first end of the first air deflector located on a sky side and a first end of the second air deflector located on a sky side are respectively connected to inner wall surfaces of the two side walls, the first end of the first air deflector is higher than the highest position of the first air outlet on a sky side, the first end of the second air deflector is higher than the highest position of the second air outlet on a sky side, and a second end of the first air deflector located on a ground side and a second end of the second air deflector located on a ground side are both disposed at a center position between the two side walls.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
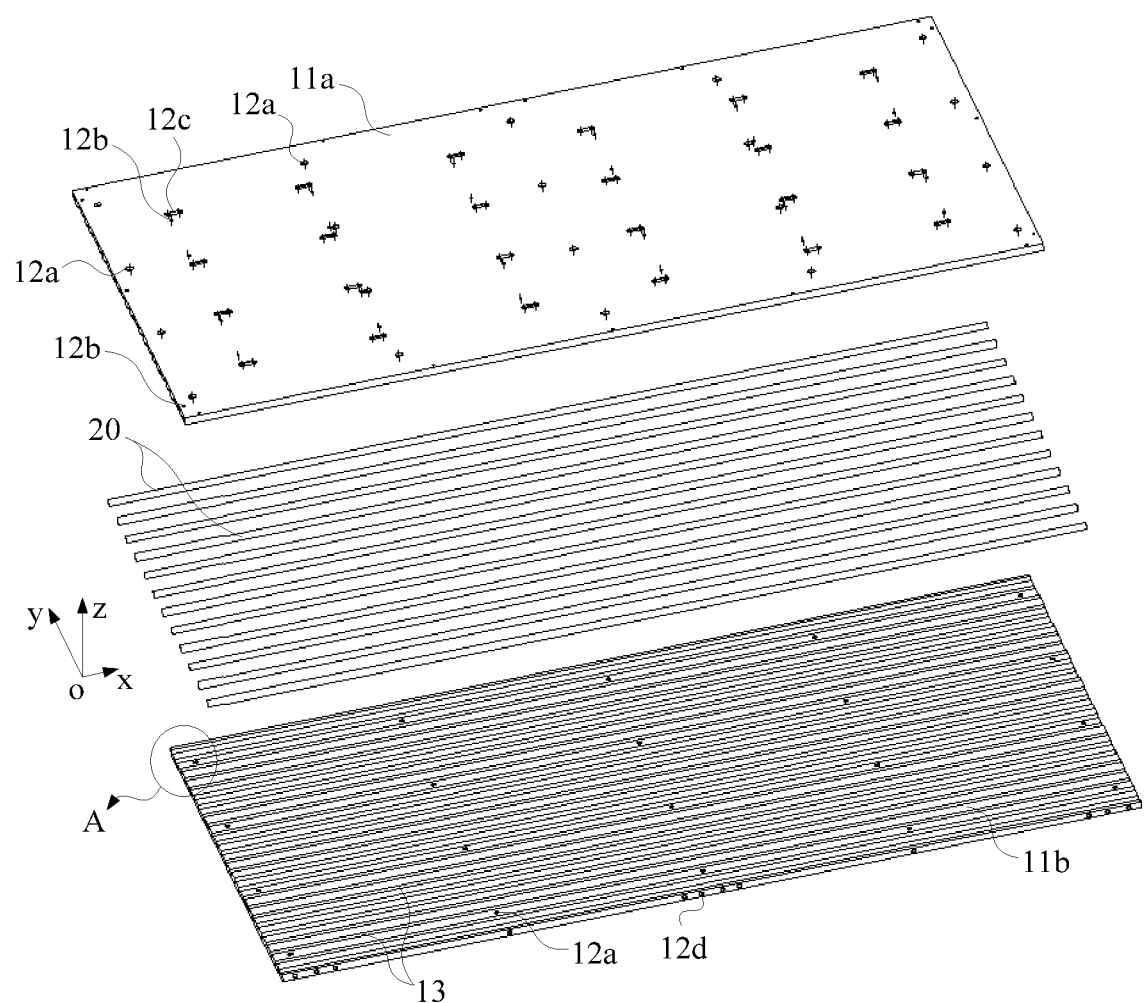
FIG. 1 is an exploded structural view of a first backplane, a first heat sink, and a second backplane in an embodiment of a display device according to the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise/include", "contain" or variants thereof means that the element before the word covers the element (s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

When the ambient temperature of the display device is high (e.g., hot weather in summer), the outdoor temperature might reach 40° or more, and the surface temperature of the display module may rise rapidly under direct sunlight. In addition, the backplanes of some display module are adjacent to a light source assembly with a high heat radiation, which may result in an excessively high internal temperature of the display module during use for a long time, thereby affecting the service life of the components.

In view of this, the embodiments of the present disclosure provide a display device, an electronic device and a device mounting member, which can improve the heat radiation effect of the display module.

The display device provided in the embodiments of the present application may include a single-sided display screen (i.e., a display screen that displays in a single direction, hereinafter referred to as a single screen for short) or a double-sided display screen (i.e., a display screen that displays in two opposite directions, hereinafter referred to as a double screen for short). The single screen may be a single display screen, or may include a spliced screen obtained by adjacently splicing a plurality of display screens along a plane perpendicular to a display direction of the display screen. Either display screen in the double screen may be a single display screen, or may include a spliced screen obtained by splicing a plurality of screens. In the present disclosure, the display screen is also referred to as a display module, and the double screen is a combination of two display modules. The display screen is not limited to a particular type, but may be a liquid crystal display screen, an organic light emitting diode display screen or a quantum dot display screen.

Next, the embodiments of the display device of the present disclosure will be described with a double screen as an example.

Figure 2:
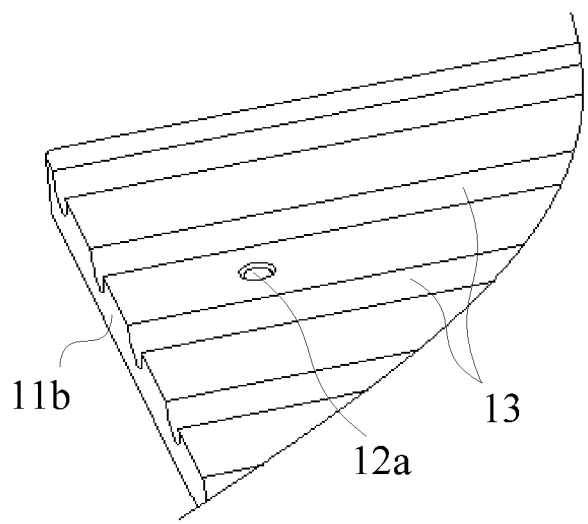
FIG. 2 is a partially enlarged schematic view of a partial structure of the second backplane on one side proximate to the first heat sink, which corresponds to a mark A in FIG. 1.
Figure 3:
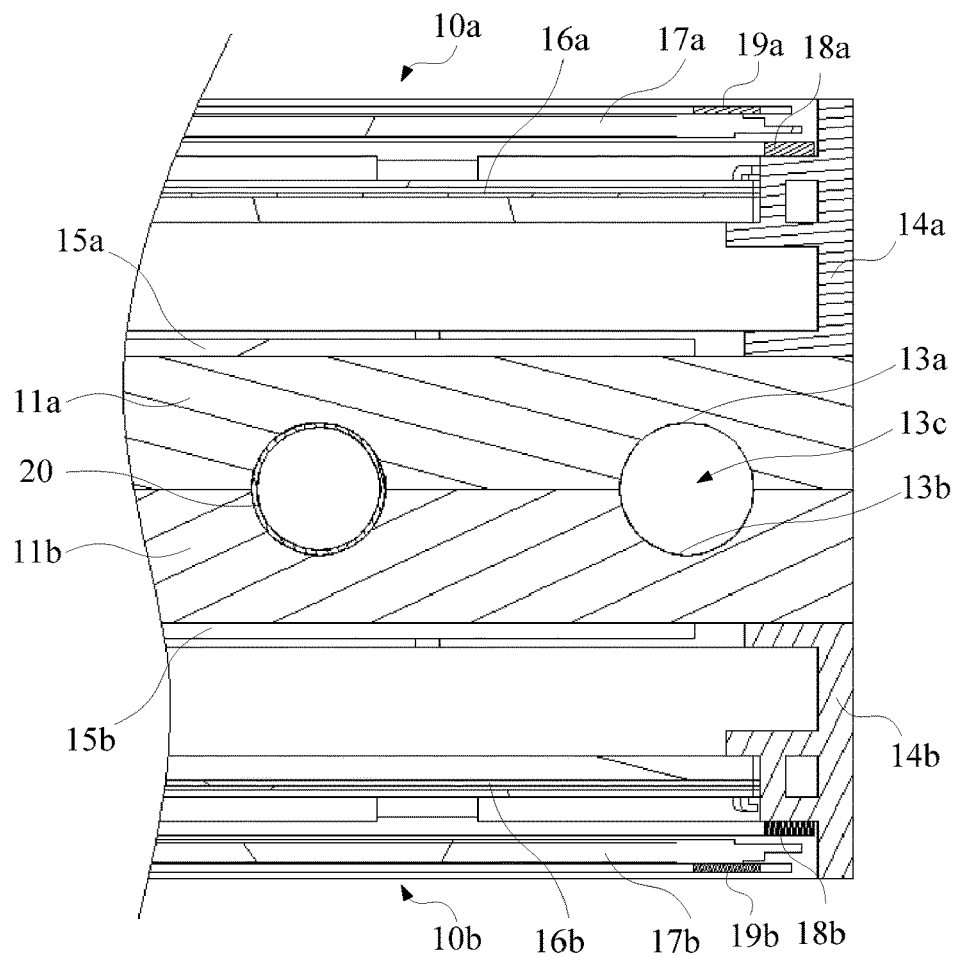
FIG. 3 is a partial schematic view of a cross-sectional structure taken along a direction perpendicular to a length direction of an elongated member in an embodiment of a display device according to the present disclosure.
Figure 4:
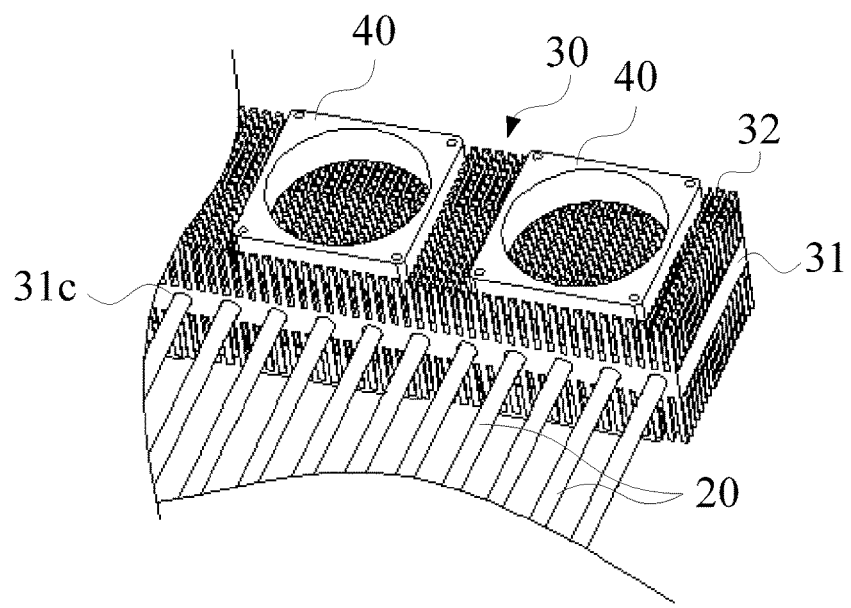
FIG. 4 is a partial schematic view of an assembled structure of a first heat sink, a second heat sink, and a third heat sink in an embodiment of a display device according to the present disclosure.
Figure 5:
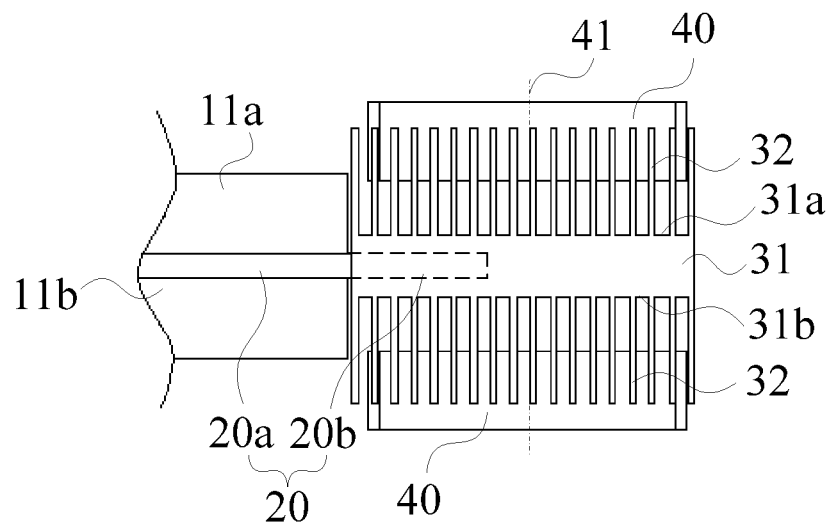
FIG. 5 is a partial schematic view of an assembled structure of a first backplane, a second backplane, a first heat sink, a second heat sink, and a third heat sink in an embodiment of a display device according to the present disclosure.

FIG. 1 is an exploded structural view of a first backplane, a first heat sink, and a second backplane in an embodiment of a display device according to the present disclosure. FIG. 2 is a partially enlarged schematic view of a partial structure of the second backplane on one side proximate to the first heat sink, which corresponds to a mark A in FIG. 1. FIG. 3 is a partial schematic view of a cross-sectional structure taken along a direction perpendicular to a length direction of an elongated member in an embodiment of a display device according to the present disclosure. FIG. 4 is a partial schematic view of an assembled structure of a first heat sink, a second heat sink, and a third heat sink in an embodiment of a display device according to the present disclosure. FIG. 5 is a partial schematic view of an assembled structure of a first backplane, a second backplane, a first heat sink, second heat sink, and a third heat sink in an embodiment of a display device according to the present disclosure.

Referring to FIGS. 1-5, in some embodiments, the display device includes: a first display module 10a, a second display module 10b, a first heat sink and a second heat sink 30. The first display module 10a has a first backplane 11a. The second display module 10b has a second backplane 11b located on an opposite side of the first backplane 11a. The first heat sink is located between the first backplane 11a and the second backplane 11b. The first heat sink may transfer heat of the first backplane 11a and the second backplane 11b to the second heat sink 30, so as to achieve heat radiation of the first backplane 11a and the second backplane 11b.

In some embodiments, the first heat sink is located between the first backplane 11a and the second backplane 11b, and respectively connected to the first backplane 11a and the second backplane 11b in thermal conduction, to achieve heat conduction.

Exemplarily, the thermally conductive connection is that the first heat sink is connected to the first backplane and/or the second backplane in direct contact, or the first heat sink is connected to the first backplane and/or the second backplane through other members so as to achieve heat conduction.

The thermally conductive connection in other embodiments of the present application may be connection in direct contact, or may also be a connection through other members.

In FIG. 1, the first backplane 11a is located at the uppermost, the second backplane 11b is located at the lowermost, and the first heat sink is located between the first backplane 11a and the second backplane 11b. When the first heat sink is assembled, the first backplane 11a, the first heat sink, and the second backplane 11b may be sequentially assembled according to an arrangement order in FIG. 1. The first backplane 11a and the second backplane 11b are arranged adjacently and oppositely, so that two display sides of the first display module 10a and the second display module 10b face towards two opposite directions.

The materials of the first backplane 11a and the second backplane 11b may be materials that are likely to conduct heat, for example metals such as aluminum and copper, or metal alloys. According to the foregoing structural form of the display module, the first backplane 11a and the second backplane 11b may be a backplane of a single display screen, an independent backplane of each of a plurality of display screens constituting a spliced screen or a common backplane of a plurality of display screens constituting a spliced screen.

In the present embodiment, the backplanes of the first display module and the second display module are arranged oppositely, and the first heat sink is disposed between the first backplane and the second backplane, so that the heat of the first backplane and the second backplane is conducted to the first heat sink and then through the second heat sink connected to the first heat sink, so that a large amount of heat produced inside the display module is released outwards through the first heat sink and the second heat sink, thereby effectively reducing a temperature inside the display module, improving the heat radiation effect of the display module and improving the service life of the display device.

In some embodiments, the shapes of the first display module 10a and the second display module 10b may be different or the same, and the sizes of the first display module 10a and the second display module 10b may be different or the same, so as to correspondingly satisfy the display needs on opposite sides of the display device. In some alternative embodiments, the shapes of the first display module 10a and the second display module 10b are both cuboid, with the same dimensions (such as overall length, width, and thickness), which may improve the interchangeability of the display modules, and facilitate the maintenance and replacement.

Referring to FIGS. 1 and 2, in some embodiments, either of the first backplane 11a and the second backplane 11b may be provided with a plurality of functional holes, for example, connection holes 12a disposed through the surface of the backplane and configured to mate with screws for fixed connection at opposite positions of two backplanes, positioning holes 12b disposed in the surfaces of the backplanes on one side away from the first heat sink, and configured to mate with positioning pins for mounting and positioning the backplanes within the display module, mounting holes or mounting slots 12c disposed in the surfaces of the backplanes on one side away from the first heat sink and configured to mount a light source assembly, securing holes 12d disposed in lateral end surfaces of the backplanes and configured to secure the backplanes with other structures outside the display module.

Referring to FIGS. 1-5, in some embodiments, the first heat sink includes one elongated member or a plurality of elongated members 20. The elongated member may be a linear elongated member, or an elongated member in the shape of a fold line, wave, or spiral. The length of the elongated member is far greater than the cross-sectional width or diameter of the elongated member. In other embodiments, the first heat sink may further include one elongated member. In other embodiments, the first heat sink may have a flat plate shape, and the length or width of first heat sink with the flat plate shape is far greater than the thickness of the first heat sink.

For the first heat sink including an elongated member, the elongated member 20 may use a solid rod or a hollow tube made from a material that is likely to conduct heat (e.g., metals such as copper or aluminum). In some embodiments, the elongated member 20 may include a heat pipe, which can achieve a very high thermal conductivity. Further, the heat pipe may include a gravity heat pipe whose wall material is metal. The gravity heat pipe may include an enclosed pipe evacuated inside, and the wall material of the pipe may be copper with a favorable thermal conductivity. A working medium such as water, acetone, or naphthalene is provided inside the enclosed pipe. The vacuum tube may be at least divided into an evaporation section and a condensation section along a length direction. The liquid-state working medium in the evaporation section is subjected to a phase change after absorbing heat and evaporated into a gaseous working medium. The gaseous working medium moves to the condensation section to release heat, and is phase changed into a liquid working medium. The liquid working medium can flow back to the evaporation section under the effect of gravity, thereby realizing a heat radiation cycle. In other embodiments, the heat pipe may also include other types of heat pipes, such as a wick heat pipe internally provided with a liquid-absorbing wick.

In order to dissipate heat outward from the backplane, in some embodiments, the first heat sink may include a first heat radiation portion and a second heat radiation portion. The first heat radiation portion is located between the first backplane and the second backplane, and distributed over an entire overlapping area of the first backplane and the second backplane. The overlapping area of the first backplane and the second backplane refers to an area where the first backplane and the second backplane overlap each other from the perspective of a vertical direction of the backplane. The second heat radiation portion is integrally formed with the first heat radiation portion, and extends beyond the overlapping area of the first backplane and the second backplane. The second heat sink is located on one side of the first display module and the second display module adjacent to the second heat radiation portion, and connected to the second heat sink in thermal conduction.

Referring to FIGS. 4 and 5, in some embodiments, each of the plurality of elongated members 20 includes a linear rod section 20a as the first heat radiation portion and an extension section 20b as the second heat radiation portion. The second heat sink 30 may include a heat conduction block 31 and a heat radiation fin group 32. The heat conduction block 31 may be connected to the second heat radiation portion of the first heat sink, for example, to the extension section 20b of each of the plurality of elongate members 20. In other embodiments, the second heat sink 30 may also include a semiconductor refrigerator that is electrically driven. A plurality of fins can also be provided on the semiconductor refrigerator to increase the heat radiation area.

In FIG. 4, the heat radiation fin group 32 is located on the surface of the heat conduction block 31, and integrally formed with the heat conduction block 31. In other embodiments, the heat radiation fin group 32 may be provided on the surface of the heat conduction block in a fixed connection manner such as adhesion, welding or plugging. The heat radiation fin group 32 may increase the heat radiation area of the heat conduction block 31 and improve the heat radiation efficiency. In addition, in order to obtain a favorable heat radiation effect, the material of the heat conduction block and the heat radiation fin group may be metal, for example, the material of the heat conduction block and the heat radiation fin group is aluminum with a favorable thermal conductivity and a light weight.

In FIG. 5, the heat conduction block 31 has a plate shape and has four side end surfaces. The heat conduction block 31 further includes a first heat radiation surface 31a and a second heat radiation surface 31b that are located between the four side end surfaces and arranged oppositely. The first heat radiation surface 31a is parallel to the display screen of the first display module 10a, and the second heat radiation surface 31b is parallel to the display screen of the second display module 10b. Considering that the air around the second heat sink 30 may be heated by the heat conduction block 31 and the heat radiation fin group 32, and the hot air may rise, the heat conduction block 31 may be disposed on the sky side of the first display module 10a and the second display module 10b, so as to prevent that the heat radiation of the display module is affected so that the temperature of the display module is raised when the hot air around the second heat sink 30 flows upward to the vicinity of the display module.

When the display device is in an operational state, there are four ends including an upper end, a lower end, a left end, and a right end. The sky side referred to in the present application is the upper end, and the ground side is the lower end.

A plurality of mounting holes 31c are provided in the surface of the heat conduction block 31 on one side adjacent to the extension section 20b. The extension section 20b of each of the plurality of elongated members 20 is fixedly plugged within the plurality of mounting holes 31c respectively. The mounting hole 31c may be a blind hole or a through hole which may be in a clearance fit with the extension section 20b, so as to facilitate disassembling. For example, the diameter of the mounting hole 31c is made to be greater than that of the extension section 20b by 0.6 mm. In other embodiments, the extension section 20b may also be in an interference fit with the mounting hole 31c so as to make the connection therebetween more reliable.

Referring to FIGS. 4 and 5, in some embodiments, the heat radiation fin group 32 includes a plurality of plate type or needle type heat radiation fins entirely or partly distributed along at least one of the first heat radiation surface 31a and the second heat radiation surface 31b. A plurality of plate type or needle type heat radiation fins may be arranged on the heat radiation surface in a random or array manner. The height of the fins relative to the heat radiation surface may be greater than the distance between the two heat radiation surfaces (i.e., the thickness of the heat conductor 31 in the direction perpendicular to the heat radiation surface), so as to maximize the heat radiation area of the second heat sink 30.

In order to improve the heat radiation efficiency of the second heat sink, in some embodiments, the display device further includes a third heat sink. The third heat sink may be mounted on the second heat sink, and configured to assist the heat conduction block and the heat radiation fin group to radiate heat. In other embodiments, the third heat sink may also be mounted outside the second heat sink, that is, not in direct connection or contact with the second heat sink. Taking the third heat sink including the first fan as an example, the first fan may be fixedly mounted on the surface of the second heat sink, or may be disposed at a position with a certain distance from the second heat sink to perform air cooling and heat radiation of the second heat sink by the output cold air flow. With the assistance of the third heat sink, the second heat sink achieves active heat radiation. The third heat sink which is not limited to assist the second heat sink to radiate heat by air cooling, may also adopt other active heat radiation manners such as water cooling. In other embodiments, it is also possible not to provide the third heat sink, but use such a manner that the heat of the second heat sink is passively dissipated into ambient air, which may reduce energy consumption and reduce the cost.

Referring to FIGS. 4 and 5, in some embodiments, the third heat sink includes one or more first fans 40. In order to facilitate observing the relative positional relationship between the first fan and the heat radiation fins, the rotary shaft and blades of the first fan 40 are not shown, and one or more first fans 40 are provided on the plurality of plate type or needle type heat radiation fins and fixedly connected to the heat conduction block 31 for air cooling the heat conduction block 31 and the heat radiation fin group 32. In FIG. 5, a plurality of needle type heat radiation fins are distributed over an entirety of the first heat radiation surface 31a and an entirety of the second heat radiation surface 31b. The plurality of first fans 40 include at least two axial fans disposed on the needle type heat radiation fins located on the first heat radiation surface 31a and distributed at intervals along a direction parallel to the first heat radiation surface 31a, and at least two axial fans disposed on the needle type heat radiation fins located on the second heat radiation surface 31b and distributed at intervals along a direction parallel to the second heat radiation surface 31b. By distributing a plurality of needle type heat radiation fins integrally on the two heat radiation surfaces of the heat conduction block 31, it is possible to greatly increase the heat radiation area of the second heat sink, and enhance the heat radiation efficiency. At least two axial fans are provided on each heat radiation surface, so that it is possible to reduce a temperature of more fins under the effect of air-cooling. In other embodiments, the first fan 40 may also include other types of fans, such as radial fans and centrifugal fans.

Referring to FIG. 5, in some embodiments, the first heat radiation surface is parallel to the second heat radiation surface, and the plurality of needle type heat radiation fins are parallel to each other, and perpendicular to the first heat radiation surface and the second heat radiation surface. The air inlet end of the axial fan may be located on one side of the axial fan adjacent to the heat conduction block, and the air outlet end of the axial fan may be located on one side of the axial fan away from the heat conduction block. The rotation axis of the axial fan is parallel to the plurality of needle type heat radiation fins. The axial fan may extract the hot air between the needle type heat radiation fins and the heat radiation surface of the heat conduction block, so as to reduce the temperature of the second heat sink.

When there a cooling air flow flowing through the display screen surfaces of the first display module 10a and the second display module 10b, and when the cooling air flow flows to the vicinity of the axial fan, it is possible to merge with the hot air flow exhausted by the axial fan 40 and exhaust them outwards, so as to accelerate the circulation of hot air flow of the axial fan and improve the heat radiation efficiency. In addition, the heat radiation surfaces on both sides of the heat conduction block 31 and the heat radiation fins provided on the heat radiation surfaces on both sides may be made to be symmetrical, so that the heat radiation on both sides of the heat conduction block is more uniform. By allowing the plurality of needle type heat radiation fins to be parallel to each other, and the rotation axis 41 of the axial fan to be parallel to the plurality of needle type heat radiation fins, it is possible to allow a more smooth flow of the air flow between an interior and an exterior of the heat radiation fin group, which is favorable for exhausting the hot air among the heat radiation fins in the shortest path.

In other embodiments, the air inlet end of the axial fan may also be disposed on one side of the axial fan away from the heat conduction block, and the air outlet end of the axial fan may be disposed on one side of the axial fan adjacent to the heat conduction block, which may blow the cool air outside the second heat sink towards among the needle type heat radiation fins and the heat radiation surface of the heat conduction block, so as to achieve the temperature of the second heat sink.

In order to reduce the overall space occupied by the axial fan after installation on the needle type heat radiation fins, referring to FIG. 5, the length of the needle type heat radiation fin among the plurality of needle type heat radiation fins located in the area where the axial fan is arranged is shorter than the length of the needle type heat radiation fin among the plurality of needle type heat radiation fins located around the area where the axial fan is arranged, so as to form a concave structure in which the axial fan is mounted. In other words, there is certain thickness overlap of the axial fan with the needle type heat radiation fins in the direction perpendicular to the heat radiation surface of the heat conduction block respectively, so that the space occupied in the thickness direction may be reduced by such thickness overlap.

After being embedded in the concave structure, the axial fan may be fixedly connected to the heat radiation fin group 32 or the heat conduction block 31 through a connecting piece (e.g., a screw or a snap-fit). A connection structure, such as a screw hole or a clamping slot, may be reserved on the heat radiation fin group 32 or the heat conduction block 31, for connection with the connecting piece. In this way, in addition to reducing the overall space occupation of the second heat sink and the third heat sink, it is also possible to allow that the axial fan is not likely to offset within a plane perpendicular to the rotation axis 41 of the axial fan, thereby making a more stable installation.

In FIG. 5, the air outlet end of the axial fan may protrude toward the air outlet side relative to the needle type heat radiation fin among the plurality of needle type heat radiation fins located around the area where the axial fan is arranged. In this way, the air inlet end is located among the plurality of needle type heat radiation fins, and the air outlet end is located outside the plurality of needle type heat radiation fins, so that the axial fan may effectively exhaust the hot air of the needle type heat radiation fins and the heat radiation surface outward from the air outlet end, thereby improving the heat radiation effect.

Referring to FIG. 3, in some embodiments, a plurality of first linear elongated grooves 13a are provided on one side of the first backplane 11a adjacent to the second backplane 11b, and a plurality of second linear elongated grooves 13b are provided on one side of the second backplane 11b adjacent to the first backplane 11a. The plurality of second linear elongated grooves 13b are in one-to-one correspondence with the plurality of first linear elongated grooves 13a, and enclose a plurality of linear accommodating cavities 13c with the plurality of first linear elongated grooves 13a. The linear rod sections of the plurality of elongated members 20 are respectively located in the plurality of linear accommodating cavities.

By providing the linear rod sections of the elongated members in the linear accommodating cavities enclosed by the first linear elongated groove and the second linear elongated groove, it is possible to effectively fix a position of the elongated member between the first backplane and the second backplane, and make a more compact structure after combination and less occupation space. Moreover, the mated structure of the elongated member and the elongated groove is simpler, and easily machined. The linear accommodating cavity may be covered on an outer side of the linear rod section of the elongated member in a circumferential direction and at least partially in contact with a contour of the linear rod section of the elongated member to achieve heat conduction. In order to improve the heat conduction effect between the linear rod section and each of the first linear elongated groove and the second linear elongated groove, it is possible to allow that the cross-section of the inner wall of the linear accommodating cavity and the cross-section of the outer wall of the linear rod section at a corresponding position may have the same shape, and the sizes of both satisfy a transition or interference fit relationship, so that the linear accommodating cavity can be closely attached to the surface of the linear rod section.

In other embodiments, the first backplane and the second backplane may be provided with elongated grooves that match the number and shape of the elongated members. For example, elongated grooves with a fold line shape, a wavy shape, or a spiral shape are provided to match the elongated members in a fold line shape, a wavy shape, or a spiral shape.

Referring to the coordinate system in FIG. 1, each of the first backplane 11a and the second backplane 11b has four side end surfaces (respectively along the x-axis direction and the y-axis direction), and an inner surface and an outer surface that are located between the four side end surfaces and oppositely arranged (along the z-axis direction). The four side end surfaces include a first side end surface (located upstream along the x-axis direction) and a second side end surface (located downstream along the x-axis direction) respectively corresponding to a sky side and a ground side of the display device.

A plurality of first linear grooves are located in the outer surface of the first backplane 11*a*, and extend from the first side end surface of the first backplane 11*a* to the second side end surface of the first backplane 11*a*. A plurality of first linear grooves are sequentially arranged in the outer surface of the first backplane 11*a* along the y-axis. For example, a plurality of first linear grooves are arranged in parallel and at equal intervals from the third side end surface of the first backplane 11*a* (located upstream along the y-axis) to the fourth side end surface of the first backplane 11*a* (located downstream along the y-axis).

A plurality of second linear grooves are located in the outer surface of the second backplane 11*b*, and extend from the first side end surface of the second backplane 11*b* to the second side end surface of the second backplane 11*b*. A plurality of second linear grooves are also sequentially arranged in the outer surface of the second backplane 11*b* along the y-axis, and every second linear groove may be parallel to each other with the same interval as that of the plurality of first linear grooves, so that one of the plurality of second linear grooves can be aligned with respective one of the first linear grooves.

The linear rod sections of the plurality of elongated members 20 extend from the first side end surface of the second backplane 11*b* to the second side end surface of the second backplane 11*b*. The linear rod sections of the elongated members 20 may be disposed in the linear accommodating cavity enclosed by each of the first linear groove and each of the second linear groove, or may be arranged in a plurality of linear accommodating cavities at intervals along the y-axis.

By extending the linear groove from the first side end surface to the second side end surface of the backplane, the elongated member may perform heat exchange with the backplane by means of the linear groove in a greater range, so as to achieve a larger area of heat radiation. By arranging a plurality of linear grooves in parallel and at the same interval in the outer surface of the backplane, it is possible to allow the heat exchange between the backplane and a plurality of elongated members to be more uniform, so that there is more balanced heat radiation of the backplane and the risk of local overheating is reduced.

In other embodiments, according to the heating difference at different locations of the backplane, a plurality of linear grooves may also be arranged not to be parallel to each other, and a plurality of adjacent linear grooves may have at least two different intervals.

Referring to FIG. 3, the inner cross-sections of each of the plurality of first linear grooves and each of the plurality of second linear grooves may be a part of a circle, and correspondingly, the outer cross-section of the linear rod section is a circle. More specifically, the inner cross-section of each of the plurality of first linear grooves and each of the plurality of second linear grooves may be a semi-circle with an equal radius, and the outer cross-section of the linear rod section is a circle having the same radius as the semi-circle. In this way, the linear rod section may be very closely attached to the first linear groove and the second linear groove. In other embodiments, the inner cross-sections of the first linear groove and the second linear groove may also be a part of an ellipse, and correspondingly, the outer cross-section of the linear rod section is an ellipse mated with the linear groove and the second linear groove.

In other embodiments, the shape of the inner cross-section of each linear groove may be different, or the shape is the same and the size is different, so that it is possible to form accommodating cavities having different shapes and/or different sizes, so as to mate with linear rod sections with outer cross-sections in different shapes and/sizes.

Referring to FIG. 3, in some embodiments, the first display module 10*a* may further include: a first frame, a first light source assembly 15*a*, a first optical film 16*a*, and a first liquid crystal screen 17*a*. The first frame is disposed on one side of the first backplane 11*a* away from the second backplane 11*b*. The first light source assembly 15*a* is disposed within the first frame, and connected to the first backplane 11*a*. The first optical film 16*a* is disposed within the first frame, and located on one side of the first light source assembly 15*a* away from the first backplane 11*a*. The first liquid crystal screen 17*a* is disposed within the first frame, and located on one side of the first optical film 16*a* away from the first backplane 11*a*.

In FIG. 3, the first frame may include a first outer frame 14*a*, a first middle frame 18*a*, and a first front frame 19*a*. The first liquid crystal screen 17*a* is disposed between the first middle frame 18*a* and the first front frame 19*a*. The first light source assembly 15*a* and the first optical film 16*a* are disposed inside the first outer frame 14*a* and the first middle frame 18*a*, so that direct-type backlight can be provided to the first liquid crystal screen 17*a*. The first backplane 11*a* may absorb the heat produced by the first light source assembly 15*a*, and conduct the heat to the elongated member 20.

Similarly, referring to FIG. 3, in some embodiments, the second display module 10*b* may further include: a second frame, a second light source assembly 15*b*, a second optical film 16*b*, and a second liquid crystal screen 17*b*. The second frame is disposed on one side of the second backplane 11*b* away from the first backplane 11*a*. The second light source assembly 15*b* is disposed within the second frame, and connected to the second backplane 11*b*. The second optical film 16*b* is disposed in the second frame, and located on one side of the second light source assembly 15*b* away from the second backplane 11*b*. The second liquid crystal screen 17*b* is disposed within the second frame, and located on one side of the second optical film 16*b* away from the second backplane 11*b*.

In FIG. 3, the second frame may include a second outer frame 14*b*, a second middle frame 18*b*, and a second front frame 19*b*. The second liquid crystal screen 17*b* is disposed between the second middle frame 18*b* and the second front frame 19*b*. The second light source assembly 15*b* and the second optical film 16*b* are disposed inside the second outer frame 14*b* and the second middle frame 18*b*, so that direct-type backlight can be provided to the second liquid crystal screen 17*b*. The second backplane 11*b* may absorb the heat produced by the second light source assembly 15*b*, and conduct the heat to the elongated member 20.

Figure 6:
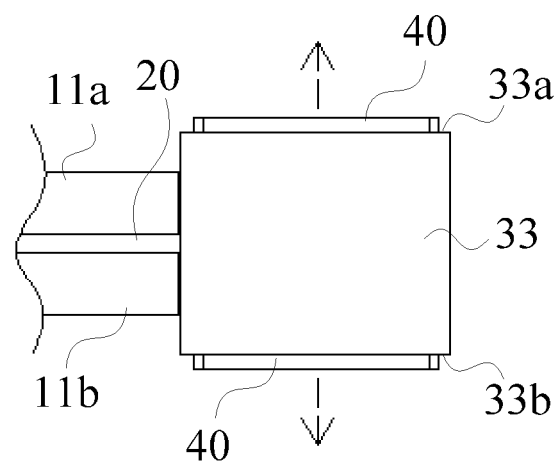
FIG. 6 is a partial schematic view of an assembled structure of a second backplane, a first heat sink, a second heat sink having a cover body, and a third heat sink in another embodiment of a display device according to the present disclosure.

FIG. 6 is a partial schematic view of an assembled structure of a second backplane, a first heat sink, a second heat sink having a cover body, and a third heat sink in another embodiment of a display device according to the present disclosure.

Referring to FIG. 6, in some embodiments, the second heat sink may further include a cover body 33. The cover body 33 has at least one open end. The inner side wall of the cover body 33 may at least partially cover the heat conduction block 31 and the heat radiation fin group 32. The one or more first fans 40 may be configured to exhaust the hot air gathered within the cover body 33 outwards via the open end of the cover body. In this way, the heat from the heat conduction block 31 and the heat radiating fin group 32 gathered by the sleeve 33 may be rapidly exhausted outwards under the effect of the first fan 40, thereby further improving the heat radiation efficiency of the second heat sink.

In FIG. 6, the cover body 33 may have two open ends 33a and 33b that are opposite in position. Referring to FIG. 5, a plurality of needle type heat radiation fins are distributed over an entirety of the first heat radiation surface 31a and an entirety of the second heat radiation surface 31b. The cover body 33 has four inner side walls, which are respectively closely attached to the four side end surfaces of the heat conduction block 31, and integrally covered outside the plurality of needle type heat radiation fins in the length direction of the needle type heat radiation fins. As can be seen from FIG. 6, the cover body 33 can shield the heat conduction block 31 and the needle type heat radiation fins on both sides of the heat conduction block 31 in the length direction of the needle type heat radiation fins, so that heat can be gathered to a greater extent. The air outlet end of the first fan 40 may protrude outwards with respect to the open end of the cover body 33 so as to output the gathered heat to the outside of the cover body 33.

The above-described embodiments of the display device may be used for various electronic devices, such as light boxes, signage and the like for outdoor display.

Figure 7:
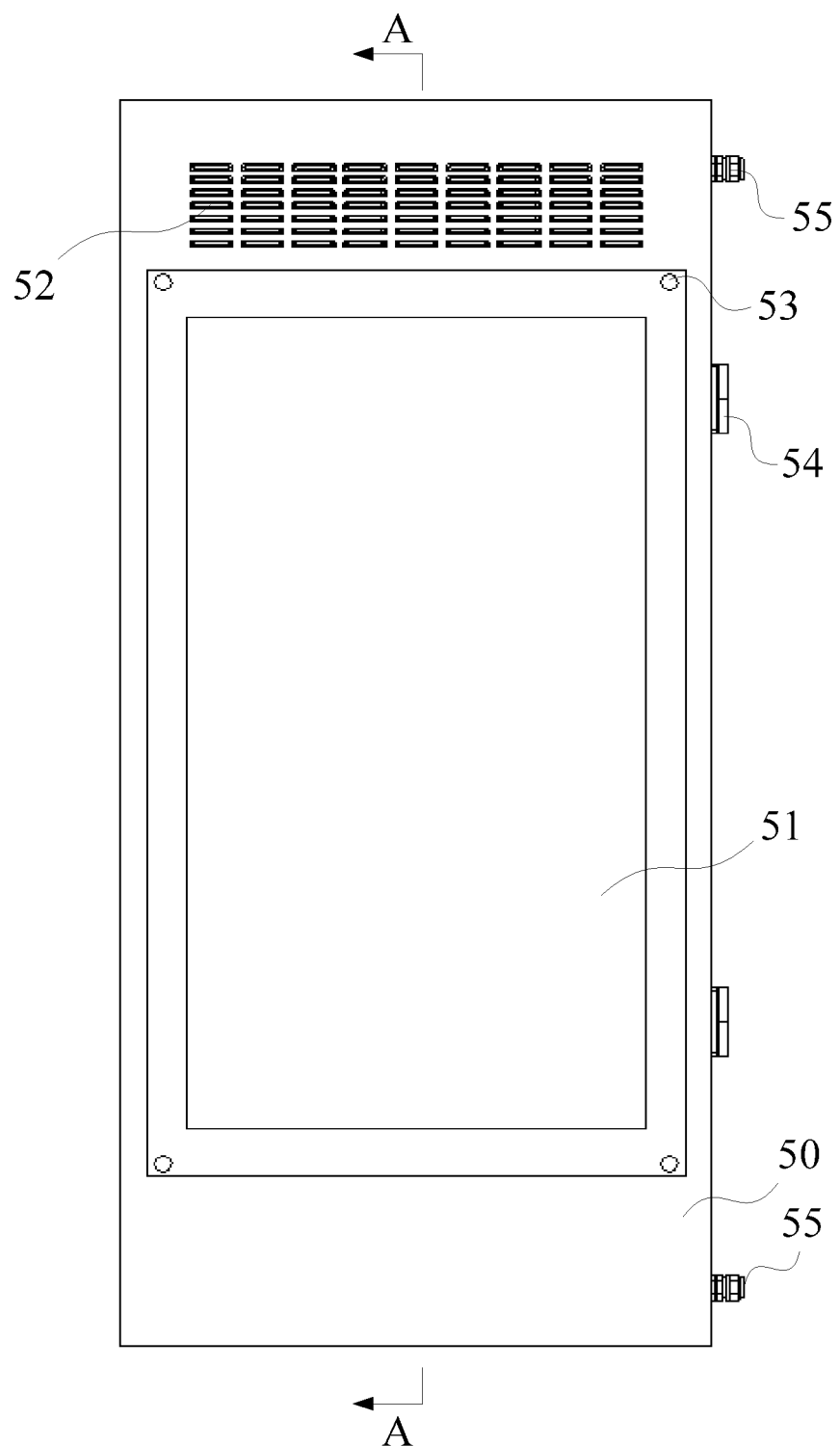
FIG. 7 is a schematic view of an external structure in an embodiment of an electronic device according to the present disclosure.
Figure 8:
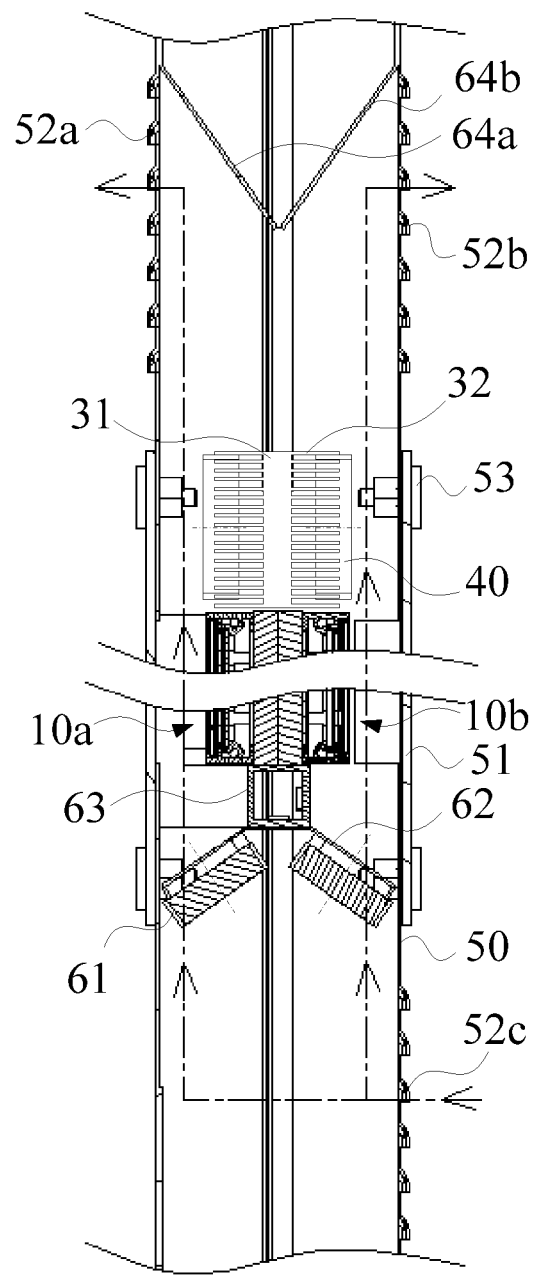
FIG. 8 is a partial schematic view from an air outlet on a sky side to an air inlet on a ground side in an AA section in FIG. 7.
Figure 9:
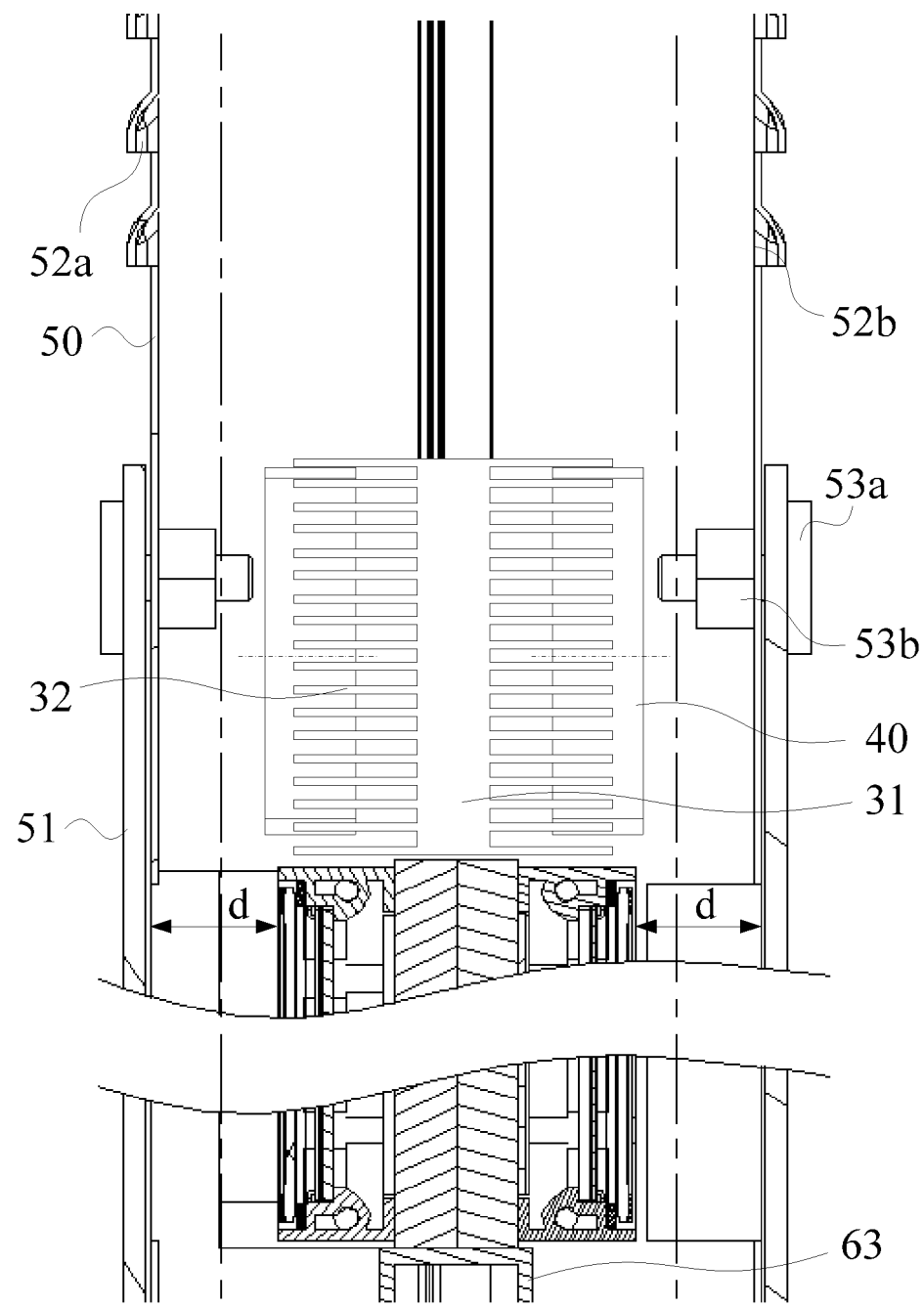
FIG. 9 is a partially enlarged schematic view of an assembled structure of a display device within a housing of the device in FIG. 8.

FIG. 7 is a schematic view of an external structure in an embodiment of an electronic device according to the present disclosure. FIG. 8 is a partial schematic view from an air outlet on a sky side to an air inlet on a ground side in an AA section in FIG. 7. FIG. 9 is a partially enlarged schematic view of an assembled structure of a display device within a housing of the device in FIG. 8.

Referring to FIGS. 7 and 8, in some embodiments, the electronic device includes: the display device in the foregoing embodiments, a device housing 50 and a second fan 61. The device housing 50 is enclosed outside the display device. The second fan 61 is disposed within the device housing 50, and located on the ground side of the first display module 10a and the second display module 10b of the display device. The second heat sink 30 of the display device is located on the sky side of the first display module 10a and the second display module 10b. In FIG. 8, the device housing 50 may be internally provided with a support frame 63, such that the display device is mounted and supported on the sky side of the support frame 63. The second fan 61 may be fixedly connected below the support frame 63 through a fan mounting frame 62. The support frame 63 may be fixedly connected to the device housing 50, and its cross section may be a hollow rectangle.

In FIG. 8, the heat conduction block 31 and the heat radiation fin group 32 included in the second heat sink 30 and the first fan 40 included in the third heat sink are both located on the sky side of the first display module 10a and the second display module 10b. The second fan 61 may guide the air flow having a relatively low temperature within the device housing 50 to flow through the display device so as to take away the heat produced by the display device. After merging with the hot air extracted by the first fan 40 from the heat conduction block 31 and the heat radiation fin group 32, the air flow flowing through the display device is exhausted towards an exterior of the device housing.

In FIGS. 7 and 9, transparent windows 51 are provided at positions of side walls of the device housing 50 corresponding to the first display module 10a and the second display module 10b of the display device, with a certain distance maintained between the transparent window 51 and each of the first display module 10a and the second display module 10b of the display device, so as to ensure that there is ventilation gaps d therebetween. In some embodiments, the ventilation gaps on both sides are equal, so that there is more uniform air flow passing through the first display module 10a and the second display module 10b, thereby avoiding an excessively high local temperature.

The second fan 61 may guide the air flow through the ventilation gap d and carry away the heat in the surface of the display screen of the display module. The transparent window 51 may include a transparent glass or plastic plate fixed on the opening opened on the device housing 50 through the connecting piece 53. In FIG. 9, the connecting piece 53 includes a bolt 53a and a nut 53b. The transparent window 51 may be made from toughened glass, which has a certain strength whilst transmitting light, thereby preventing the transparent window 51 from being damage under impact and affecting the components inside the device housing 50.

Referring to FIG. 8, the fan mounting frame 62 may be mounted with two groups of second fans 61, which are respectively configured for the air cooling effect of the respective display screens of the first display module 10a and the second display module 10b. Either group of second fans 61 may include at least one second fan 61. The intermediate section of the fan mounting frame 62 may be fixedly connected to the lower surface of the support frame 63, and the overhanging sections located on both sides of the intermediate section are fixedly connected to the two groups of second fans 61 respectively, and extend obliquely toward the ground side. Correspondingly, the blast ranges of the two groups of second fans 61 are respectively directed to the ventilation gaps between the corresponding display module and the transparent window.

In FIG. 8, the device housing 50 may further include: an air inlet 52c, a first air outlet 52a, and a second air outlet 52b. One air inlet 52c is opened in a side wall of the device housing 50 on the same side as the transparent window 51 corresponding to one of the first display module 10a and the second display module 10b, and located on the ground side of the second fan 51. Each of the air inlet 52c, the first air outlet 52a, and the second air outlet 52b may include a plurality of slits, and an arc-shaped shield may be provided on the upper edge of the outer wall of the device housing 50 corresponding to each slit, so as to prevent dust or rain outside the device housing 50 from entering an interior of the device housing 50. In addition, the device housing 50 may also be provided with an interface 55 for connecting a power supply.

The first air outlet 52a and the second air outlet 52b are respectively opened on the first side wall and the second side wall of the device housing 50 opposite and parallel to each other, and located on the sky side of the first display module 10a and the second display module 10b. The first side wall is on the same side as the transparent window corresponding to the first display module 10a, and the second side wall is on the same side as the transparent window corresponding to the second display module 10b. The end of the second heat sink located on the sky side is not higher than the lowest position of the first air outlet 52a and the second air outlet 52b on the ground side respectively.

Referring to the air flow direction indicated by the arrow in FIG. 8, under the drive of the second fan 61, the air outside the device housing 50 may enter an interior of the device housing 50 from the air inlet 52c, and then be exhausted outwards from the first air outlet 52a and the second air outlet 52b via the second fan 51, the ventilation gap d and a lateral side of the second heat sink. In this way, cold air from the outside may first take away the heat on the surface of the display screen of the display module upward through the ventilation gap, so as to achieve the air-cooling effect of the display screen, and at the same time air-cooling the second heat sink that absorbs heat from the first heat sink. During the process that the second heat sink is air-cooled, the second heat sink may continuously receive the heat conducted from the backplane of the display module via the first heat sink, thereby achieving effective heat radiation of the backplane.

Referring to FIG. 8, in some embodiments, the electronic device may further include an air deflector structure. The air deflector structure is located on one side of the device housing adjacent to the first air outlet and/or the second air outlet, and configured to guide the air flow within the device housing to be discharged outwards via the first air outlet and/or the second air outlet. In FIG. 8, the first air deflector 64a and the second air deflector 64b are respectively disposed inside the first air outlet 52a and the second air outlet 52b within the device housing 50, and both located on the sky side of the second heat sink, and configured to guide the air flow within the device housing 50 to be exhausted outwards via the first air outlet 64a and the second air outlet 64b respectively.

The first end of the first air deflector 64a located on the sky side is connected to the inner wall surface of the first side wall, and the first end of the first air deflector 64a is higher than the highest position of the first air outlet 52a on the sky side. The second end of the first air deflector 64b located on the ground side is disposed at a center position between the first side wall and the second side wall. The first end of the second air deflector 64b located on the sky side is connected to the inner wall surface of the second side wall, and the first end of the second air deflector 64b is higher than the highest position of the second air outlet 52b on the sky side. The second end of the second air deflector 64a located on the ground side is disposed at a center position between the first side wall and the second side wall. In this way, two streams of air flows coming from the ground side and passing through the two ventilation gaps respectively may be exhausted to the first air outlet and the second air outlet after collision with the surfaces of the first air deflector and the second air deflector, thereby achieving a reasonable path of a cooling air flow.

Based on the embodiments of the display device described above, the present disclosure also discloses a device mounting member for cooperating with the display device of any of the foregoing embodiments in use. Referring to FIGS. 7-9, the device mounting member includes: a device housing 50 and a second fan 61. Amounting area of the display device may be provided inside the device housing 50. The second fan 61 may be disposed within the device housing and located on a ground side of a mounting area of the display device. The display device and the device mounting member may be sold as independent products respectively and assembled as needed.

In another embodiment of the above-described device mounting member, two transparent windows 51 are provided in positions of two opposite side walls of the device housing 50 corresponding to the mounting area of the display device. The two transparent windows 51 are parallel with a spacing greater than the width of the display device in a direction perpendicular to the two transparent windows 51. In this way, after the display device is mounting to a mounting area within the device housing 50, a ventilation gap may be formed between each of the two display screens of the display device and the two transparent windows 51 respectively.

Referring to FIG. 8, the device housing of the device mounting member may further include: an air inlet 52c, a first air outlet 52a, and a second air outlet 52b. The air inlet 52c is opened in a side wall of the device housing 50 on the same side as one of the two transparent windows, and located on the ground side of the second fan 61. The first air outlet 52a and the second air outlet 52b are respectively opened in the two side walls, and both located on the sky side of a mounting area of the display device.

In order to guide the air flow inside the device housing 50, referring to FIG. 8, in some embodiments, the device mounting member may further include a first air deflector 64a and a second air deflector 64b. The first air deflector 64a and the second air deflector 64b are respectively disposed within the device housing 50 and located inside the first air outlet 52a and the second air outlet 52b, and both located on the sky side of a mounting area of the display device, and configured to guide the air flow within the device housing to be exhausted outwards via the first air outlet 52a and the second air outlet 52b respectively.

The first end of the first air deflector 64a located on the sky side and the first end of the second air deflector 64b located on the sky side are respectively connected to the inner wall surfaces of the two side walls. The first end of the first air deflector 64a is higher than the highest position of the first air outlet 52a on the sky side. The first end of the second air deflector 64b is higher than the highest position of the second air outlet 52b on the sky side. The second end of the first air deflector 64a located on the ground side and the second end of the second air deflector 64b located on the ground side are both disposed at a center position between the two side walls.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display device, comprising:
   a first display module having a first backplane;
   a second display module having a second backplane located on an opposite side of the first backplane;
   a first heat sink located between the first backplane and the second backplane; and
   a second heat sink connected to the first heat sink in thermal conduction,
   wherein the first heat sink comprises:
   a first heat radiation portion located between the first backplane and the second backplane, and distributed over an entire overlapping area of the first backplane and the second backplane; and
   a second heat radiation portion integrally with the first heat radiation portion and extending beyond the overlapping area of the first backplane and the second backplane;

wherein the second heat sink is located on one side of the first display module and the second display module adjacent to the second heat radiation portion, and connected to the second heat radiation portion in thermal conduction.

2. The display device according to claim 1, wherein the second heat sink comprises:
   a heat conduction block connected to the second heat radiation portion; and
   a heat radiation fin group located on a surface of the heat conduction block, and integrally with the heat conduction block or disposed on the heat conduction block.

3. The display device according to claim 2, wherein the heat conduction block has a plate shape and has four side end surfaces, and a first heat radiation surface and a second heat radiation surface that are located between the four side end surfaces and arranged oppositely, wherein the first heat radiation surface is parallel to a display screen of the first display module, and the second heat radiation surface is parallel to a display screen of the second display module.

4. The display device according to claim 3, wherein the first heat sink comprises a plurality of elongated members, each of which comprises a linear rod section as the first heat radiation portion and an extension section as the second heat radiation portion, and a plurality of mounting holes are provided in a surface of the heat conduction block on one side adjacent to the extension section, wherein the extension section of each of the plurality of elongated pieces is plugged fixedly within the plurality of mounting holes respectively.

5. The display device according to claim 4, wherein a plurality of first linear elongated grooves are provided on one side of the first backplane adjacent to the second backplane, and a plurality of second linear elongated grooves are provided on one side of the backplane adjacent to the first backplane, and the plurality of second linear elongated grooves are in one-to-one correspondence with the plurality of first linear elongated grooves, and enclose a plurality of linear accommodating cavities with the plurality of first linear elongated grooves, and linear rod sections of the plurality of elongated members are respectively located in the plurality of linear accommodating cavities.

6. The display device according to claim 3, wherein material of the heat conduction block and the heat radiation fin group is metal.

7. The display device according to claim 3, further comprising:
   a third heat sink mounted on the second heat sink or outside the second heat sink, and configured to assist the heat conduction block and the heat radiation fin group to radiate heat.

8. The display device according to claim 7, wherein the heat radiation fin group comprises a plurality of plate type or needle type heat radiation fins entirely or partly distributed along at least one heat radiation surface of the first heat radiation surface and the second heat radiation surface; and the third heat sink comprises one or more first fans, which are disposed on the plurality of plate type or needle type heat radiation fins, fixedly connected with the heat conduction block, and configured to air-cool the heat conduction block and the heat radiation fin group.

9. The display device according to claim 8, wherein a plurality of needle type heat radiation fins are distributed over an entirety of the first heat radiation surface and an entirety of the second heat radiation surface, the plurality of first fans comprise at least two axial fans disposed on the needle type heat radiation fins located on the first heat radiation surface and distributed at intervals along a direction parallel to the first heat radiation surface, and at least two axial fans disposed on the needle type heat radiation fins located on the second heat radiation surface and distributed at intervals along a direction parallel to the second heat radiation surface.

10. The display device according to claim 9, wherein the first heat radiation surface is parallel to the second heat radiation surface, and the plurality of needle type heat radiation fins are parallel to each other, and perpendicular to the first heat radiation surface and the second heat radiation surface, an air inlet end of the axial fan is located on one side of the axial fan adjacent to the heat conduction block, and an air outlet end of the axial fan is located on one side of the axial fan away from the heat conduction block, and a rotation axis of the axial fan is parallel to the plurality of needle type heat radiation fins.

11. The display device according to claim 9, wherein a length of a needle type heat radiation fin among the plurality of needle type heat radiation fins located in an area where the axial fan is arranged is shorter than a length of a needle type heat radiation fin among the plurality of needle type heat radiation fins located around the area where the axial fan is arranged, so as to form a concave structure in which the axial fan is mounted.

12. The display device according to claim 11, wherein an air outlet end of the axial fan protrudes toward an air outlet side relative to a needle type heat radiation fin among the plurality of needle type heat radiation fins located around the area where the axial fan is arranged.

13. The display device according to claim 8, wherein the second heat sink further comprises:
   a cover body having at least one open end,
   wherein an inner side wall of the cover body at least partially covers the heat conduction block and the heat radiation fin group, and the one or more first fans are configured to exhaust hot air gathered within the cover body outwards via the open end of the cover body.

14. The display device according to claim 13, wherein the cover body has two open ends that are opposite in position, a plurality of needle type heat radiation fins are distributed over an entirety of the first heat radiation surface and an entirety of the second heat radiation surface, the cover body has four inner side walls, which are respectively closely attached to the four side end surfaces of the heat conduction block, and integrally covered outside the plurality of needle type heat radiation fins in a length direction of the needle type heat radiation fins.

15. An electronic device comprising the display device according to claim 1.

16. A device mounting member for cooperating with the display device according to claim 1 in use, wherein the device mounting member comprises:
   a device housing internally provided with a mounting area of the display device; and
   a second fan disposed within the device housing and located on a ground side of the mounting area of the display device.

17. The device mounting member according to claim 16, wherein two transparent windows are provided in positions of two opposite side walls of the device housing corresponding to the mounting area of the display device, and the two transparent windows are parallel with a spacing greater than a width of the display device in a direction perpendicular to the two transparent windows.

18. The device mounting member according to claim 17, wherein the device housing further comprises:

one air inlet opened in a side wall of the device housing on the same side as one of the two transparent windows, and located on a ground side of the second fan;

a first air outlet and a second air outlet, which are respectively opened in the two side walls, and both located on a sky side of the mounting area of the display device.

19. The device mounting member according to claim 18, further comprising:

a first air deflector and a second air deflector respectively disposed within the device housing and located inside the first air outlet and the second air outlet, and both located on a sky side of the mounting area of the display device, configured to guide an air flow within the device housing to be exhausted outward through the first air outlet and the second air outlet respectively, wherein a first end of the first air deflector located on a sky side and a first end of the second air deflector located on a sky side are respectively connected to inner wall surfaces of the two side walls, the first end of the first air deflector is higher than the highest position of the first air outlet on a sky side, the first end of the second air deflector is higher than the highest position of the second air outlet on a sky side, and a second end of the first air deflector located on a ground side and a second end of the second air deflector located on a ground side are both disposed at a center position between the two side walls.

* * * * *